(12) United States Patent
Puurunen et al.

(10) Patent No.: US 11,385,049 B2
(45) Date of Patent: Jul. 12, 2022

(54) APPARATUS ASSOCIATED WITH ANALYSIS OF THIN FILM LAYER AND MANUFACTURING METHOD THEREOF

(71) Applicant: TEKNOLOGIAN TUTKIMUSKESKUS VTT OY, Espoo (FI)

(72) Inventors: Riikka Puurunen, Espoo (FI); Feng Gao, Espoo (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 0 days.

(21) Appl. No.: 16/096,083

(22) PCT Filed: Apr. 25, 2017

(86) PCT No.: PCT/FI2017/050312
§ 371 (c)(1),
(2) Date: Oct. 24, 2018

(87) PCT Pub. No.: WO2017/187016
PCT Pub. Date: Nov. 2, 2017

(65) Prior Publication Data
US 2019/0120620 A1   Apr. 25, 2019

(30) Foreign Application Priority Data

Apr. 26, 2016   (FI) ...................................... 20165361

(51) Int. Cl.
*G01B 21/08*   (2006.01)
*G01B 21/00*   (2006.01)
(Continued)

(52) U.S. Cl.
CPC ............ *G01B 21/08* (2013.01); *C23C 16/045* (2013.01); *C23C 16/52* (2013.01); *G01B 21/00* (2013.01)

(58) Field of Classification Search
None
See application file for complete search history.

(56) References Cited

U.S. PATENT DOCUMENTS 4,134,066 A * 1/1979 Vogel ........................ G01B 3/02
257/797
5,589,689 A   12/1996 Koskinen
(Continued)

FOREIGN PATENT DOCUMENTS

CN   101819030   9/2010
CN   103262207   8/2013
(Continued)

OTHER PUBLICATIONS

Puurunen et al (Supporting Information, Saturaion profile based conformality analysis for atomic layer deposition: aluminum oxide lateral high-aspect ratio channels, 2020.*
(Continued)

*Primary Examiner* — Charles Capozzi
(74) *Attorney, Agent, or Firm* — Robert P. Michal, Esq.; Carter, DeLuca & Farrell LLP

(57) ABSTRACT

An apparatus associated with an analysis of a thin film layer comprises two layer structures (100, 102) with a cavity (104) therebetween, and an opening (110) through one of the layer structures (102) to the cavity (104), the cavity (104) being configured to receive, through the opening (110), material used to form a thin film layer (900) inside the cavity (104). At least one of the two layer structures (100, 102) comprises at least one positional indicator (108) for an analysis associated with the thin film layer (900).

9 Claims, 6 Drawing Sheets

(51) Int. Cl.
  *C23C 16/52* (2006.01)
  *C23C 16/04* (2006.01)

(56) References Cited

U.S. PATENT DOCUMENTS

| | | |
|---|---|---|
| 6,930,366 B2 | 8/2005 | Kiihamäki |
| 2004/0053435 A1 | 3/2004 | Ikushima et al. |
| 2005/0167597 A1 | 8/2005 | Yokura et al. |
| 2007/0032054 A1 | 2/2007 | Ramaswamy et al. |
| 2013/0147021 A1 | 6/2013 | Puurunen et al. |
| 2014/0049818 A1* | 2/2014 | Schlaudraff ............ G02B 21/34 359/397 |
| 2014/0111811 A1 | 4/2014 | Tuohiniemi |
| 2014/0178978 A1* | 6/2014 | Cate ..................... G01N 21/78 435/287.7 |

FOREIGN PATENT DOCUMENTS

| | | |
|---|---|---|
| CN | 103733035 | 4/2014 |
| JP | 53-118797 | 10/1978 |
| JP | 2005-504644 | 2/2005 |
| JP | 2009-218151 | 9/2009 |
| JP | 2014-522510 | 9/2014 |
| WO | WO 2011/161318 | 12/2011 |
| WO | 2012/085335 | 6/2012 |
| WO | WO 2012/168545 | 12/2012 |

OTHER PUBLICATIONS

International Search Report for PCT/FI2017/050312, dated Jul. 18, 2017, 3 pages.
Written Opinion of the ISA for PCT/FI2017/050312, dated Jul. 18, 2017, 6 pages.
Search Report for FI20165361, dated Nov. 1, 2016, 2 pages.
Gao et al., "Microscopic silicon-based lateral high-aspect-ratio structures for thin film conformality analysis", Journal of Vacuum Science and Technology A: Vacuum, Surfaces and Films. American Vacuum Society, vol. 33, No. 1, (2015), pp. 010601-1-010601-5, http://dx.doi.org/10.1116/1.4903941.
Kariniemi et al., "Conformality of Remote Plasma-Enhanced Atomic Layer Deposition Processes: An Experimental Study", J. Vac. Sci. Technol. A, Jan./Feb. 2012, vol. 30, No. 1, pp. 01A115-1-01A115-5.
Dendooven et al., "Conformality of $Al_2O_3$ and AlN Deposited by Plasma-Enhanced Atomic Layer Deposition", Journal of the Electrochemical Society, vol. 157, No. 4, pp. G111-G116 (2010).
Office Action issued in CN Appln. No. 201780025310.0 dated Apr. 2, 2020 (w/ translation).
"PillarHall Test Chip HAR4 Data Sheet" VTT Technical Research Centre of Finland Ltd, Dec. 2018.
Office Action issued in JP App. No. 2018-555770 dated Apr. 7, 2021 (w/ translation).
Notification of Reason for Refusal issued by the Korean Intellectual Property Office in relation to Korean Application No. 10-2018-7033138 dated May 14, 2021, English translation (4 pages).
Written Opinion issued by the Korean Intellectual Property Office in relation to Korean Application No. 10-2018-7033138 dated Jul. 14, 2021 English translation (7 pages).
Notification to Grant Patent Rights for Invention issued by The State Intellectual Property Office of People's Republic of China in relation to Chinese Application No. 201780025310 dated May 21, 2021 English translation (2 pages).
Written Opinion issued by the Japanese Patent Office in relation to Japanese Application No. 2018-555770 dated Jun. 25, 2021 English translation (2 pages).
Decision to Grant a Patent issued by the Japanese Patent Office in relation to Japanese Application No. 2018-555770 dated Aug. 4, 2021 English translation (2 pages).

* cited by examiner

| Major indicators | Distance | Looks like this (opening is on the left) | Line width, μm | intermediate space between |
|---|---|---|---|---|
|   | 10 μm  | \| | 0.5 |   |
|   | 20 μm  | \| | 0.5 |   |
|   | 30 μm  | \| | 0.5 |   |
|   | 40 μm  | \| | 0.5 |   |
|   | 50 μm  | \| | 1 |   |
|   | 60 μm  | \| | 0.5 |   |
|   | 70 μm  | \| | 0.5 |   |
|   | 80 μm  | \| | 0.5 |   |
|   | 90 μm  | \| | 0.5 |   |
| x | 100 μm | \|\| | 2 - 0.5 | 1 |
|   | 110 μm | \| | 0.5 |   |
|   | 120 μm | \| | 0.5 |   |
|   | 130 μm | \| | 0.5 |   |
|   | 140 μm | \| | 0.5 |   |
|   | 150 μm | \| | 1 |   |
|   | 160 μm | \| | 0.5 |   |
|   | 170 μm | \| | 0.5 |   |
|   | 180 μm | \| | 0.5 |   |
|   | 190 μm | \| | 0.5 |   |
| x | 200 μm | \| \| | 2 - 0.5 | 2 |
|   | 210 μm | \| | 0.5 |   |
|   | 220 μm | \| | 0.5 |   |
|   | 230 μm | \| | 0.5 |   |
|   | 240 μm | \| | 0.5 |   |
|   | 250 μm | \| | 1.0 |   |
|   | 260 μm | \| | 0.5 |   |
|   | 270 μm | \| | 0.5 |   |
|   | 280 μm | \| | 0.5 |   |
|   | 290 μm | \| | 0.5 |   |
| x | 300 μm | \| \| | 2 - 0.5 | 3 |
|   | 350 μm | \| | 1.0 |   |
| x | 400 μm | \| \| | 2 - 0.5 | 4 |
|   | 450 μm | \| | 1.0 |   |
| x | 500 μm | \| \| | 2 - 0.5 | 5 |
|   | 550 μm | \| | 1.0 |   |
| x | 600 μm | \| \| | 2 - 0.5 | 6 |
|   | 650 μm | \| | 1.0 |   |
| x | 700 μm | \| \| | 2 - 0.5 | 7 |
|   | 750 μm | \| | 1.0 |   |
| x | 800 μm | \| \| | 2 - 0.5 | 8 |
|   | 850 μm | \| | 1.0 |   |
| x | 900 μm | \| \| | 2 - 0.5 | 9 |
|   | 950 μm | \| | 1.0 |   |
| x | 1000 μm | \|\|\| | 2 - 0.5 - 0.5 | 1, 1 |

FIG. 6D

| Major indicators | Distance | Looks like this (opening is on the left) | Line width, μm | intermediate space between |
|---|---|---|---|---|
|   | 1100 μm | \|\|\| | 0.5 - 0.5 - 0.5 | 1, 1 |
|   | 1200 μm | \|\| \| | 0.5 - 0.5 - 0.5 | 1, 2 |
|   | 1300 μm | \|\|  \| | 0.5 - 0.5 - 0.5 | 1, 3 |
|   | 1400 μm | \|\|   \| | 0.5 - 0.5 - 0.5 | 1, 4 |
|   | 1500 μm | \|\|    \| | 0.5 - 0.5 - 0.5 | 1, 5 |
|   | 1600 μm | \|\|     \| | 0.5 - 0.5 - 0.5 | 1, 6 |
|   | 1700 μm | \|\|      \| | 0.5 - 0.5 - 0.5 | 1, 7 |
|   | 1800 μm | \|\|       \| | 0.5 - 0.5 - 0.5 | 1, 8 |
|   | 1900 μm | \|\|        \| | 0.5 - 0.5 - 0.5 | 1, 9 |
| x | 2000 μm | \| \|\| | 2 - 0.5 - 0.5 | 2, 1 |
|   | 2100 μm | \| \|\| | 0.5 - 0.5 - 0.5 | 2, 1 |
|   | 2200 μm | \|\|\| | 0.5 - 0.5 - 0.5 | 2, 2 |
|   | 2300 μm | \|\| \| | 0.5 - 0.5 - 0.5 | 2, 3 |
|   | 2400 μm | \|\|  \| | 0.5 - 0.5 - 0.5 | 2, 4 |
|   | 2500 μm | \|\|   \| | 0.5 - 0.5 - 0.5 | 2, 5 |
|   | 2600 μm | \|\|    \| | 0.5 - 0.5 - 0.5 | 2, 6 |
|   | 2700 μm | \|\|     \| | 0.5 - 0.5 - 0.5 | 2, 7 |
|   | 2800 μm | \|\|      \| | 0.5 - 0.5 - 0.5 | 2, 8 |
|   | 2900 μm | \|\|       \| | 0.5 - 0.5 - 0.5 | 2, 9 |
| x | 3000 μm | \|  \|\| | 2 - 0.5 - 0.5 | 3, 1 |
|   | 3100 μm | \|  \|\| | 0.5 - 0.5 - 0.5 | 3, 1 |
|   | 3200 μm | \| \|\| | 0.5 - 0.5 - 0.5 | 3, 2 |
|   | 3300 μm | \|\|\| | 0.5 - 0.5 - 0.5 | 3, 3 |
|   | 3400 μm | \|\| \| | 0.5 - 0.5 - 0.5 | 3, 4 |
|   | 3500 μm | \|\|  \| | 0.5 - 0.5 - 0.5 | 3, 5 |
|   | 3600 μm | \|\|   \| | 0.5 - 0.5 - 0.5 | 3, 6 |
|   | 3700 μm | \|\|    \| | 0.5 - 0.5 - 0.5 | 3, 7 |
|   | 3800 μm | \|\|     \| | 0.5 - 0.5 - 0.5 | 3, 8 |
|   | 3900 μm | \|\|      \| | 0.5 - 0.5 - 0.5 | 3, 9 |
| x | 4000 μm | \|   \|\| | 2 - 0.5 - 0.5 | 4, 1 |
|   | 4100 μm | \|   \|\| | 0.5 - 0.5 - 0.5 | 4, 1 |
|   | 4200 μm | \|  \|\| | 0.5 - 0.5 - 0.5 | 4, 2 |
|   | 4300 μm | \| \|\| | 0.5 - 0.5 - 0.5 | 4, 3 |
|   | 4400 μm | \|\|\| | 0.5 - 0.5 - 0.5 | 4, 4 |
|   | 4500 μm | \|\| \| | 0.5 - 0.5 - 0.5 | 4, 5 |
|   | 4600 μm | \|\|  \| | 0.5 - 0.5 - 0.5 | 4, 6 |
|   | 4700 μm | \|\|   \| | 0.5 - 0.5 - 0.5 | 4, 7 |
|   | 4800 μm | \|\|    \| | 0.5 - 0.5 - 0.5 | 4, 8 |
|   | 4900 μm | \|\|     \| | 0.5 - 0.5 - 0.5 | 4, 9 |

FIG. 6E

APPARATUS ASSOCIATED WITH ANALYSIS OF THIN FILM LAYER AND MANUFACTURING METHOD THEREOF

This application is the U.S. national phase of International Application No. PCT/FI2017/050312 filed 25 Apr. 2017, which designated the U.S. and claims priority to FI Patent Application No. 20165361 filed 26 Apr. 2016, the entire contents of each of which are hereby incorporated by reference.

FIELD

The invention relates to an apparatus associated with an analysis of a thin film layer, and a method of manufacturing the apparatus.

BACKGROUND

Conformal thin films are used in significant technological applications ranging from semiconductor devices to energy applications, catalysis and pharmaceuticals. "Conformality" means the ability of a thin film to cover all surfaces of a three-dimensional object with the same thickness, composition, and properties.

For quick and repeatable analysis of the conformality, the conformality test structures should have a reliable internal length scale calibration. For example, equipment manufacturers, precursor companies, semiconductor device manufacturers and/or other companies associated with atomic layer deposition and/or chemical vapor deposition (ALD/CVD) would like to have accurate means to analyse conformality. Additionally universities and/or research institutes often need a proper equipment to perform conformality analysis. However, there is no accurate or standard way to analyse thin film conformality, although a lateral high-aspect-ratio (LHAR) test structure made with silicon techniques has lately been used for the analysis. Hence, there is a need to improve the test structure.

BRIEF DESCRIPTION

The present invention seeks to provide an improvement in the measurements. According to an aspect of the present invention, there is provided an apparatus associated with an analysis of a thin film layer as specified in claim 1.

According to another aspect of the present invention, there is provided a method of manufacturing an apparatus associated with an analysis of a thin film layer in claim 10.

The invention has advantages. The at least one positional indicator enables the analysis of the thin film layer faster, more accurate and easier.

LIST OF DRAWINGS

Example embodiments of the present invention are described below, by way of example only, with reference to the accompanying drawings, in which FIGS. 1 to 5 illustrate an examples of an apparatus associated with the analysis of a thin film layer;

FIG. 6D illustrates an example number of lines and their positions with respect to each other in range distances from 0 µm to 1000 µm;

FIG. 6E illustrates an example number of lines and their positions with respect to each other in range distances from 1100 µm to 4900 µm;

DESCRIPTION OF EMBODIMENTS

The following embodiments are only examples. Although the specification may refer to "an" embodiment in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

It should be noted that while Figures illustrate various embodiments, they are simplified diagrams that only show some structures and/or functional entities. The connections shown in the Figures may refer to logical or physical connections. It is apparent to a person skilled in the art that the described apparatus may also comprise other functions and structures than those described in Figures and text. It should be appreciated that details of some functions or structures are irrelevant to the actual invention. Therefore, they need not be discussed in more detail here.

Figure 1:
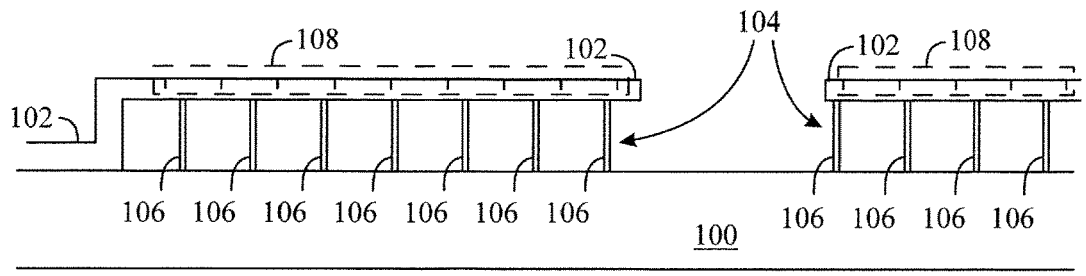

FIGS. 1 to 5 illustrate examples of an apparatus associated with the analysis of a thin film layer. In FIG. 1, the apparatus, which may comprise a chip of a lateral high-aspect-ratio LHAR structure, comprises a substrate 100 which may be made of silicon, for example. The substrate 100 may also be made of $SiO_2$ (silicon dioxide silica, quartz), germanium (Ge), gallium arsenide (GaAs) or the like. The apparatus also comprises a membrane 102, which may be made of polysilicon, for example. The membrane 102 may be made of the same material or materials as the substrate 100. The thickness of the membrane 102 may range from tens of nanometers to ten thousand nanometers, for example. The thickness of the membrane 102 is, however, not limited to this range. Thus, the apparatus comprises two layer structures one of which is the substrate 100 and another of which is the membrane 102.

A cavity 104 spreads out horizontally between the two layer structures 100, 102. The apparatus has also an opening 110 through the membrane 102 to the cavity 104. The cavity 104 is configured to receive, through the opening 110, material used to form a thin film layer 900 (see FIG. 9) inside the cavity 104. A height of the cavity 104 may be in a range from tens of nanometers to two thousand nanometers, for example. The height of the cavity 104 is, however, not limited to this range.

Figure 2:
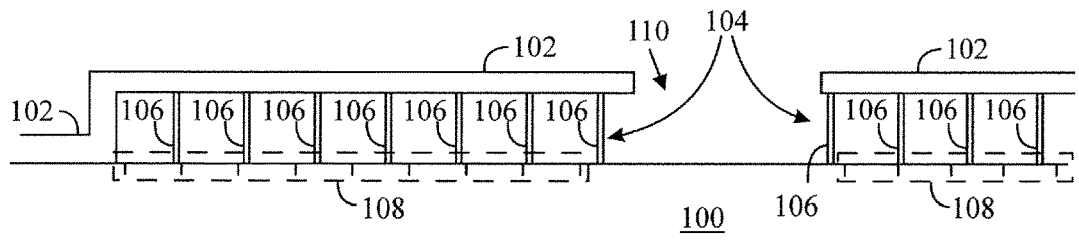
Figure 3:
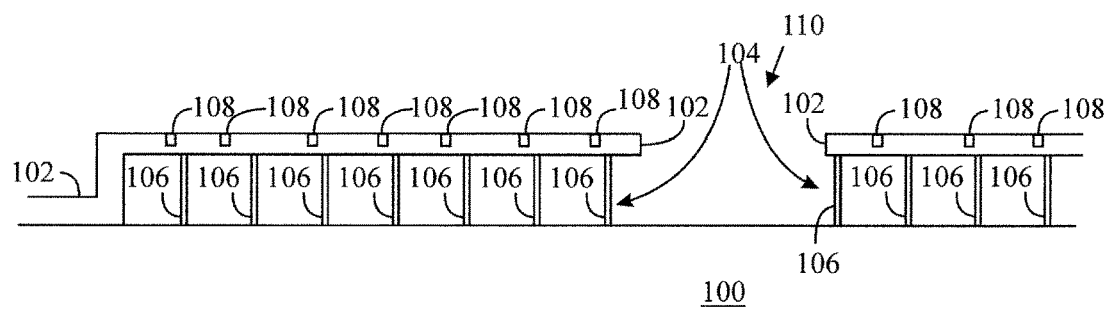

In an embodiment shown in FIGS. 1 to 3, the cavity 104 has at least one pillar 106 between the two layer structures 100, 102. The pillar 106 or the pillars 106 may support the cavity 104 and prevent a collapse of the cavity 104. The at least one pillar 106 may be made of thermal oxide growth or silicon, for example.

Figure 4:
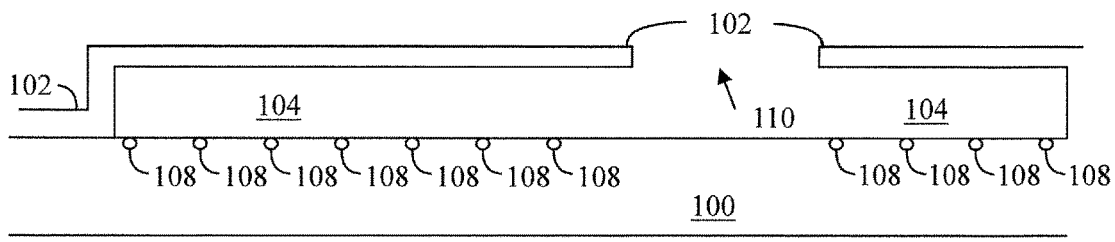
Figure 5:
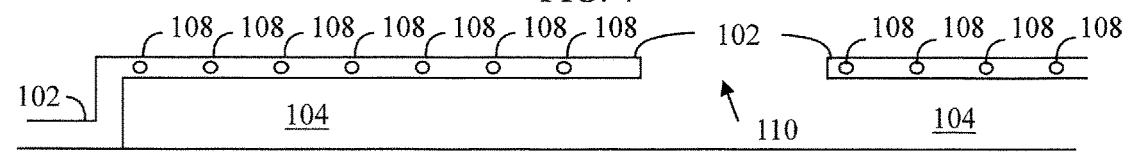

In an embodiment shown in FIGS. 4 and 5, the cavity 104 may be supportless. That is, there are no pillars 106 between the two layer structures 100, 102. In this embodiment, the cavity 104 is thus empty of solid structures extending between the substrate 100 and the membrane 102.

In FIG. 1, the membrane 102 comprises positional indicators 108, which may be utilized in an analysis of the thin film layer 900. The positional indicators 108 may be on an outer surface of the membrane 102. The outer surface is opposite to the inner surface of the membrane 102, the inner surface being a part of the surface of the cavity 104. In an embodiment, the positional indicators 108 may differ by a materialistic property from the membrane 102.

In FIG. 2, the substrate 100 comprises the positional indicators 108 which may be on a surface of the substrate 100, the substrate 100 being a part of the surface of the cavity 104. In an embodiment, the positional indicators 108 may differ by a materialistic property from the substrate 100 in a similar manner as explained of the positional indicators 108 on the membrane 102 in FIG. 1.

FIG. 3 illustrates an example of the positional indicators 108 which are materialistic parts added on the surface of the membrane 102. The materialistic parts may be of the same material as or different material from the membrane 102. The at least one positional indicator 108 is easy to add to the apparatus during the manufacturing process.

FIG. 4 illustrates an example the apparatus which has no pillars 106 in the cavity 104. FIG. 4 also illustrates an example of the positional indicators 108 which are materialistic parts added on the surface of the substrate 100. The materialistic parts may be of the same material as or different material from the substrate 100.

FIG. 5 also illustrates an example the apparatus which has no pillars 106 in the cavity 104. FIG. 5 further illustrates an example of the positional indicators 108 which are materialistic parts added inside the membrane 102. That is, the at least one positional indicator 108 may be on the surface or within the membrane 102. In this example, the materialistic parts of the positional indicators 108 are of different material from that of the membrane 102. In a similar manner, the at least one positional indicator 108 may be on or within the substrate 100.

In the manner described above it can be expressed that at least one of the two layer structures 100, 102 comprises positional indicators 108 used in the analysis of the thin film layer 900. For example, determination of how far the thin film layer 900 extends in the cavity 104 measured from the opening 110 may be based on information obtained from the positional indicators 108. Additionally, an aspect ratio (AR) may be determined on the basis of the height of the cavity 104 and the determination of how far the thin film layer 900 extends in the cavity 104. The at least one positional indicator 108, per se, doesn't limit the analysis of the thin film layer 900.

In an embodiment, the at least one positional indicator 108 may have a property, which is configured to carry information associated with a position of the at least one positional indicator 108 with respect to the opening 110. The property may refer to a dimension or a type of material of the at least one positional indicator 108. The property may refer to thickness, density, crystallinity or composition of material of the at least one positional indicator 108. The composition may refer to chemical elements or compounds of the at least one positional indicator 108. The at least one positional indicator 108 may comprise at least one pure or at least approximately pure substance of at least one chemical element or compound. The composition may refer to a mixture of chemical elements or compounds. To carry information associated with a position of the at least one positional indicator 108, the property of one positional indicator 108 may be different from that of at least one other positional indicator 108. In an embodiment, the positional indicators 108 may differ by a materialistic property from the layer structure 100, 102 on the surface of or inside which it is.

The property may carry information associated with a distance from the opening 110, for example. The distance may refer to the shortest length between the circumference of the opening 110 and the positional indicator 108, for example. The distance may be the shortest separation between the center or the longitudinal axis of the opening 110 and the positional indicator 108, for example.

In an embodiment, a cross sectional dimension of the at least one positional indicator 108 is configured to carry the information about the position. The cross sectional dimension may be a width, for example. In an embodiment, the cross sectional dimension may be parallel to the substrate 100. That is, a normal of the cross sectional dimension may thus be parallel to a normal of the substrate 100. This is convenient when the analysis of the thin film layer 900 is performed from a direction of the normal of the substrate, i.e. using a top view. In an embodiment, the cross sectional dimension may be perpendicular to the normal of the substrate 100. In an embodiment, the cross sectional dimension may be perpendicular to the substrate 100. This is convenient when the analysis of the thin film layer 900 is performed from a direction perpendicular to the normal of the substrate, i.e. using a side view.

In embodiment examples of which shown in FIGS. 6A to 6F, the at least one positional indicator 110 may comprise at least two sub-indicators 600, 602, 604 a distance between which carries the information about the position. Distances from the opening 110 may also carry the information about the position. In a similar manner, width of a positional indicator may carry information about the position.

Figure 6A:
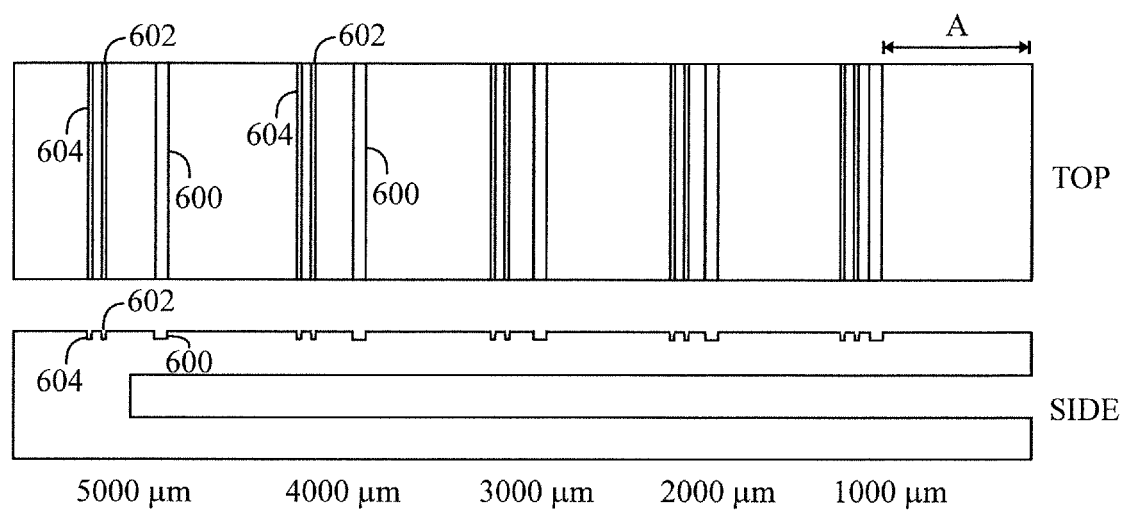
FIG. 6A illustrates an example of positional indicators in the range 1000 µm to 5000 µm.
Figure 6B:
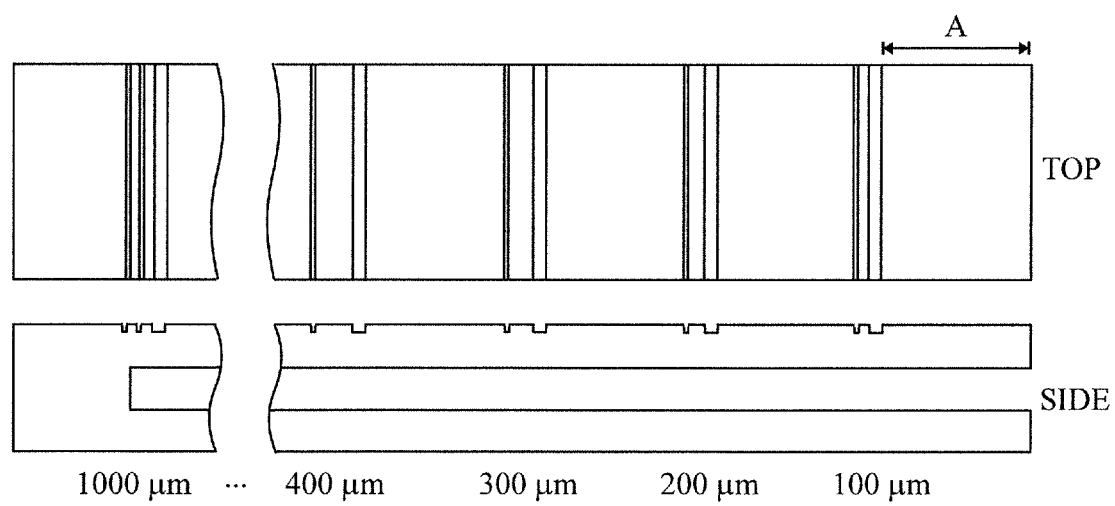
FIG. 6B illustrates an example of positional indicators in the range 100 µm to 1000 µm.
Figure 6C:
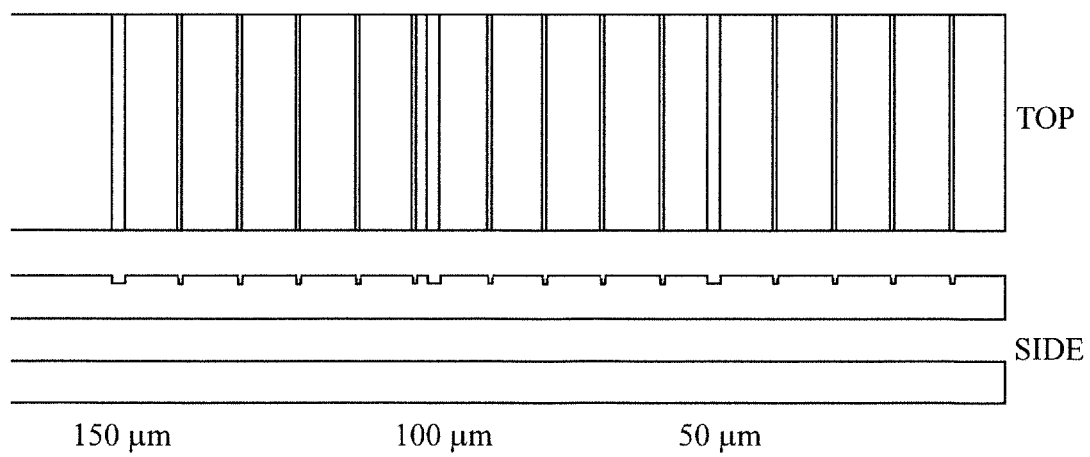
FIG. 6C illustrates an example of positional indicators in the range 0 µm to 150 µm.

In each of FIGS. 6A to 6C, there are two views with respect to the apparatus. In the upper view the apparatus is seen from top and in the lower view the apparatus is seen from side.

FIG. 6A illustrates an example of positional indicators in the range 1000 μm to 5000 μm, and the position is encoded using three lines 600, 602, 604. The line 600 is thicker than the two other lines 602, 604. The width of the line 600 may be about 2 μm, for example. The width of the thinner lines 602, 604 may be about 0.5 μm, for example. The distance between the thinner lines 602, 604 may be about 1 μm, for example. A distance between the pair of thinner lines 602, 604 and the thicker line 600 varies in a function of the position. The shortest distance between the pair of the thinner lines 602, 604 and the thicker line 600 may be about 2 μm, for example. Then the distance between the pair of the thinner lines 602, 604 and the thicker line 600 may increase with the increasing distance from the opening 110.

FIG. 6B illustrates an example of positional indicators in the range 100 μm to 900 μm, and the position is encoded using two lines 600, 602 in distances shorter than 1000 μm. The line 600 is thicker than the other line 602. The width of the line 600 may be about 2 μm also in this example. Correspondingly, the width of the thinner line 602 may be about 0.5 μm, for example. A distance between the thinner line 602 and the thicker line 600 varies in a function of the position. The shortest distance between the thinner line 602 and the thicker line 600 may be about 2 μm, for example. Then the distance between the thinner line 602 and the thicker line 600 may increase with the increasing distance from the opening 110.

FIG. 6C illustrates an example of positional indicators for 10 micrometers and 50 micrometers, and the position is encoded using one line 600 and two lines 600, 602. The line 600 is thicker than the other line 602. The width of the line 600 may be about 2 μm also in this example. Correspondingly, the width of the thinner line 602 may be about 0.5 μm, for example. Each distance from the opening 110 which is a multiple of 10 micrometers is marked with a thin line 602. An exception to this rule is each distance which is a multiple of 50 μm. These distances of multiples of 50 μm are marked with a thicker line 600. Neither of these rules hold for distance of multiples of 100 μm because these distances are marked with a combination of the thin line 602 and the thicker line 600. All these three rules may be applied when marking distances for multiples of 10 micrometers, 50 micrometers and 100 micrometers.

FIG. 6D illustrates an example number of lines and their positions with respect to each other in range distances from 0 μm to 1000 μm.

Figure 6F:
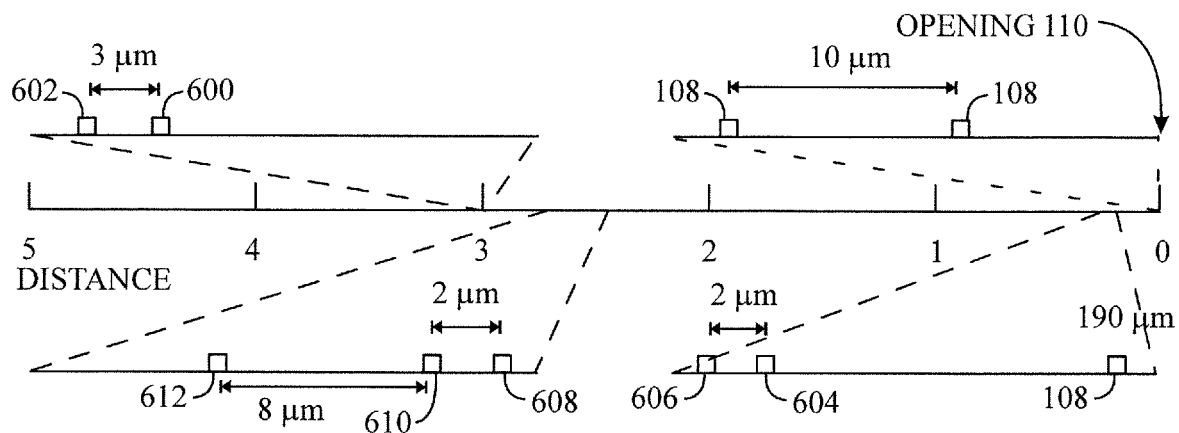
FIG. 6F illustrates an example of positional indicators comprising at least two sub-indicators.

FIG. 6E illustrates an example number of lines and their positions with respect to each other in range distances from 1100 μm to 4900 μm. In FIGS. 6E and 6F the leftmost line is the thick line 600 and the other lines are the thinner lines 602, 604.

FIG. 6F has a ruler 0 mm to 5 mm for distances between the positional indicators and the opening 110. The multiples of a predefined distance may be marked with a single element positional indicator 108, for example. The predefined distance may be 10 μm. This example is illustrated in upper right corner of FIG. 6F. For accurate and repeatable measurement of the conformality, the structures have in this manner a reliable internal length scale calibration. This is true also for other examples in this application.

All the positional indicators 108 of integer values of distances in millimeters may have two sub-indicators 600, 602. In general, all the positional indicators 108 of integer values of distances in a desired length unit may have two sub-indicators 600, 602. The separation between the sub-indicators 600, 602 may a thousand times smaller than the real distance from the opening 110, for example. Thus, a distance of three millimeters may be indicated by a distance of 3 μm between the sub-indicators 600, 602 at a position the distance from the opening 110 of which is 3 mm. In general, the separation between the sub-indicators 600, 602 may be a predetermined times smaller than the real distance from the opening 110. This example is illustrated in upper left corner of FIG. 6F.

The positional indicators 108 of distances of 100 μm and 200 μm may have two sub-indicators 604, 606 directly adjacent to the single element positional indicator 108 of the multiples of the predefined distance (10 μm). A distance between the two sub-indicators 604, 606 indicates a distance to the opening 110. The separation between the sub-indicators 604, 606 may a thousand times smaller than the real distance from the opening 110, for example. In FIG. 6F, the distance between the two sub-indicators 604, 606 is 2 μm which refers to the distance 2 mm to the opening 110. This example is illustrated in lower right corner of FIG. 6F.

The positional indicators 108 of distances of 300 μm, 400 μm, 500 μm, 600 μm, 700 μm, 800 μm and 900 μm need not include the single element positional indicator 108 of the multiples of the predefined distance (10 μm), and thus they may only have the two sub-indicators 604, 606. The distance between the sub-indicators may indicate the distance to the opening 110 in a similar manner as explained above.

At the distance 1000 μm there may be a single element positional indicator 108.

For distances larger than 1000 μm, three sub-indicators 608, 610, 612 may be used. A distance between the two sub-indicators 608, 610 at right may indicate a whole number value of the distance and a distance between the third sub-indicator 612 and one of the two sub-indicators 608, 610 may indicate a decimal value of the distance. The whole number of the distance in the example of FIG. 6F is 2 mm because the distance between the two sub-indicators 608, 610 is 2 μm. The decimal value is 0.8 mm because the distance between the third sub-indicator 612 and the second sub-indicator 610 is 8 μm. Thus, the distance to the opening is 2.8 mm in the example at the lower left corner of FIG. 6F.

In an embodiment, the position indicators 108 include a shape of numeric symbols which directly indicate the distance to the opening 110.

In an embodiment, the position indicators 108 include a shape of alphabets for directly indicating the distance to the opening 110. The alphabets may be in a human language.

In an embodiment, the position indicators 108 include a shape of writing symbols which directly indicate the distance to the opening 110. The writing symbols may be in a machine language or in a human language or symbols for an analysis system.

In an embodiment, the property is associated with material of the at least one positional indicator 108 and the property is configured to cause a unique interaction with radiation used in a detection of the position, the unique interaction being associated with the position for its indication. In this example, each of the positional indicators 108 made of a single element or of a plurality of the sub-indicators 600 to 612 have a deterministic interpretation which is different from interpretation of any other positional indicator 108.

A difference of the materialistic property may be a refraction index and/or a scattering efficiency of the radiation used in detection of the positional indicators 108. In an embodiment, the radiation used in detection of the positional indicators 108 may be optical radiation and/or radiation of electrons, for example. In an embodiment, the optical radiation may be visible light. In an embodiment, the optical radiation may be infrared light. In an embodiment, no material is added to or removed from the membrane 102 for producing the positional indicators 108. In an embodiment, the materialistic property may be density, for example, a variation of which may also vary the interaction between the radiation used in detection and the positional indicators 108.

Figure 7:
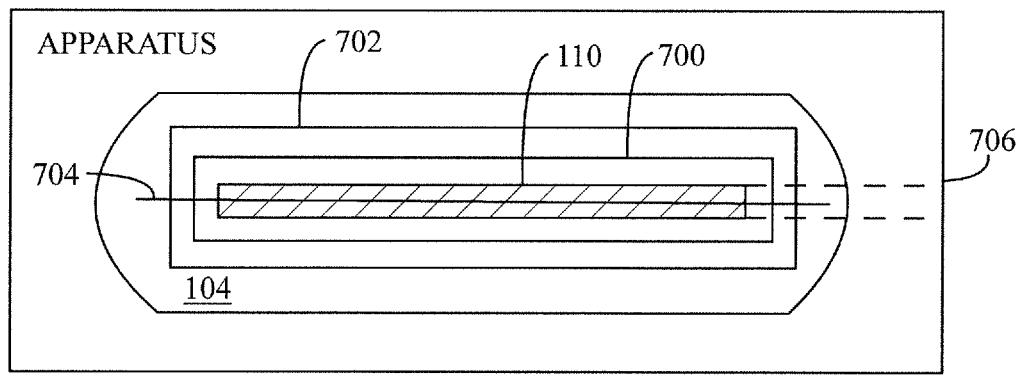
FIG. 7 illustrates a top view of an example of the apparatus.

FIG. 7 shows a top view of an example of the apparatus. In an embodiment, the opening 110 may be elongated or rectangular.

In an embodiment shown in FIG. 7, the positional indicators 108, which are at the same distance from the opening 100, form a continuous line 700, 702 around the opening 110. Different lines 700, 702 have different properties. The edge of the opening 110 may be straight or round. The opening 110 may continue to one side 706 or to both sides of the apparatus an example of which is shown with dashed lines in FIG. 7. Thus, the opening 110 may be open at one side or at both sides. More generally, the apparatus may comprise one opening 110 or more than one opening 110.

Figure 8A:
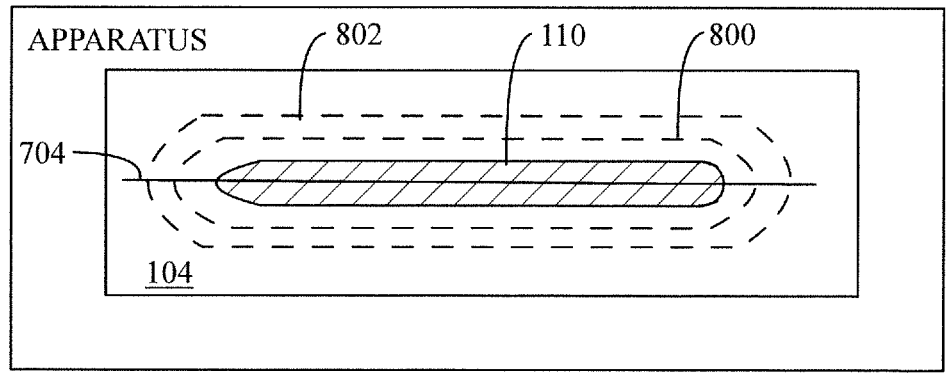
FIG. 8A illustrates another top view of an example of the apparatus.

FIG. 8A shows a top view of an example of the apparatus. In an embodiment shown in FIG. 8, the positional indicators 108, which are at the same distance from the opening 100, form discontinuous line 800, 802 around the opening 110. That is, the positional indicators 108 form a shape of the discontinuous line 800, 802. The discontinuity may be caused by a physical separation between said positional indicators 108 in the same line 800, 802.

In an embodiment, a tangent of each line 700, 702, 800, 802 formed by the positional indicators 108 is at a known angle with respect to the longitudinal axis 704 of the opening 110 which is elongated.

In an embodiment, a tangent of each line 700, 702, 800, 802 formed by the positional indicators 108 is parallel to the longitudinal axis 704 of the opening 110 which is elongated.

In an embodiment, a longitudinal axis of each of the positional indicators 108 is at a known angle with respect to the longitudinal axis 704 of the opening 110 which is elongated. The known angle may be parallel.

In an embodiment, a radial direction from a center of the opening 110 a cross section of which is a circle intersects a tangent of each line of the positional indicators 108 around the opening 110 perpendicularly. In this example, a normal of the cross section is parallel to that of the substrate 100.

In an embodiment, a radial direction from a center of the opening 110 a cross section of which is a circle intersects each of the positional indicators 108 perpendicularly.

Figure 8B:
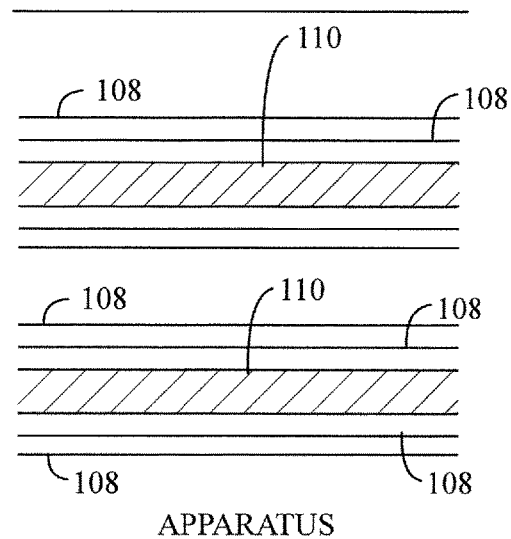
FIG. 8B illustrates an example of an apparatus with more than one opening.

In an embodiment shown in FIG. 8B, there are more than one opening 110 in the apparatus. In FIG. 8B the openings 110 are side by side but they may also be one after another. The positional indicators 108 may be related to both of the openings 110.

Figure 9:
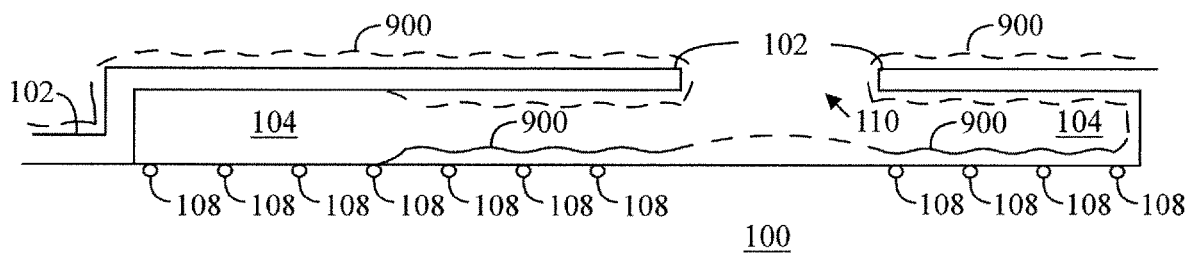
FIG. 9 illustrates an example of an apparatus a thin film layer inside a cavity.

FIG. 9 illustrates an example of the apparatus which has the thin film 900 inside the cavity 104. The material of the thin film 900 may also cover other parts of the apparatus. The material of the thin film 900 may include $Al_2O_3$, $SiO_2$, Ir (iridium), TaN (tantalum nitrogen), alucone, $HfO_2$, $ZrO_2$, $Si_3N_4$, $TiO_2$ or the like without limiting to these materials. The thin film 900 may be deposited using atomic layer deposition (ALD), chemical vapor deposition (CVD), physical vapor deposition (PVD) techniques, for example, without limiting to these. The thin film 900 has been deposited on the substrate 100 through the opening 110. The material of the thin film may also cover other surfaces of the cavity 104. For the analysis, the membrane 102 may easily be peeled off which enables a better plan-view/top-view for a visible microscope instead of a cross-section for an electron microscope. However, it is also possible that the membrane 102 is not peeled off. In a microscopic scanning of a prior art LHAR test structure the analysis may go astray because of a direction and/or position may be lost. But now, by using the scale of the at least one positional indicator 108 it is possible to have accurate estimates of the spread of the thin film layer 900 in the cavity 104. The at least one positional indicator 108 also make the analysis faster.

The analysis may thus be performed using an optical microscope or an electronic microscope, for example. The electron microscope may be a scanning electron microscope (SEM), for example. The analysis may be performed without peeling off the membrane 102. The apparatus comprising at least one LHAR chip/wafer with at least one distance indicator 108 is a suitable solution for thin film conformality analysis aimed for the semiconductor and other markets.

All in all, the existence of the at least one positional indicator enables the analysis of the thin film layer faster, more accurate and easier.

Figure 10:
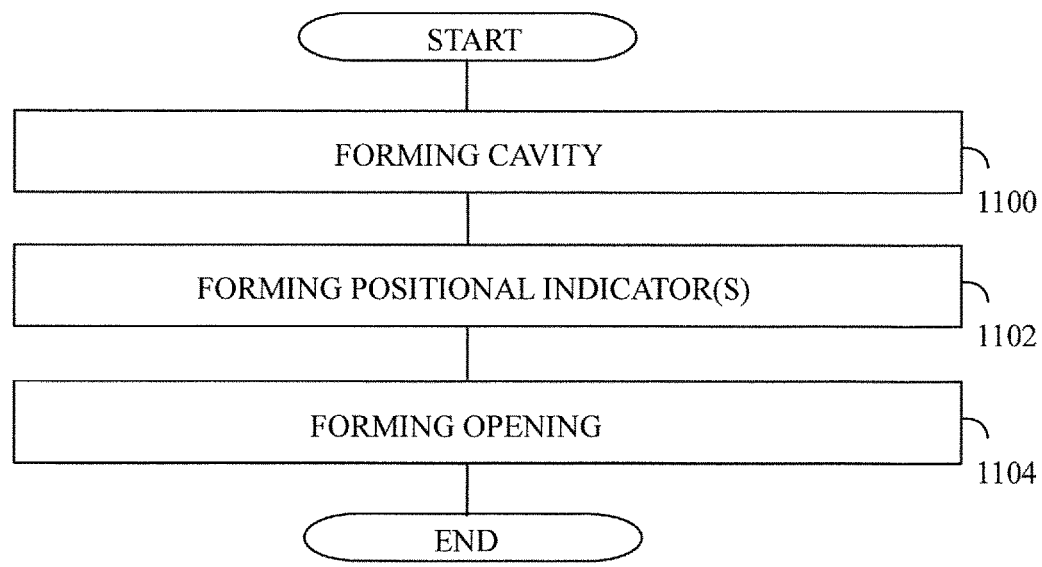
FIG. 10 illustrates an example of a flow chart of a manufacturing method of the apparatus.

FIG. 10 illustrates a flow chart of a method of manufacturing an apparatus associated with an analysis of a thin film layer. In step 1100, a cavity 104 is formed between two layer structures 100, 102. In step 1102, at least one positional indicator 108 is formed on or in at least one of the two layer structures 100, 102 for an analysis associated with the thin film layer 900. In step 1104, an opening 110 is formed through one of the layer structures 102 to the cavity 104, the cavity 104 being configured to receive, through the opening 110, material used to form a thin film layer 900 inside the cavity 104. In an embodiment, the steps 1100 to 1104 are performed in an order starting from the step 1100 and ending to the step 1104. In an embodiment, the first step may be the step 1102 and after that may come the step 1100, the step 1104 then remaining the final step.

It will be obvious to a person skilled in the art that, as technology advances, the inventive concept can be implemented in various ways. The invention and its embodiments are not limited to the example embodiments described above but may vary within the scope of the claims.

The invention claimed is:

1. An apparatus associated with an analysis of a thin film layer, wherein the apparatus comprises a chip of one or more lateral high-aspect-ratios with a two layer structure with a cavity, the two layer structure comprising a membrane layer structure and a substrate layer structure with the cavity between the membrane layer structure and the substrate layer structure, and at least one opening through one layer structure of the two layer structure to the cavity, the cavity being configured to receive, through the at least one opening, material used to form a thin film layer inside the cavity, wherein:

a thickness of the membrane layer structure ranging from tens of nanometers to ten thousand nanometers;

at least one layer structure of the two layer structure comprises a first positional indicator configured to permit a conformality analysis associated with the thin film layer; and the first positional indicator comprises two adjacent sub-indicators positioned a first known distance between one another, wherein the first known distance between the two adjacent sub-indicators represents a first distance between the first positional indicator and the at least one opening.

2. The apparatus of claim 1 comprising the thin film layer, wherein the thin film layer is selected from the group consisting of: $Al_2O_3$, $SiO_2$, Ir, TaN, alucone, $HfO_2$, $ZrO_2$, $Si_3N_4$, $TiO_2$, and mixtures thereof.

3. The apparatus of claim 1 comprising the thin film layer, wherein thin film layer is deposited through the at least one opening to the cavity by a technique selected from the group consisting of: atomic layer deposition, chemical vapor deposition, physical vapor deposition, and combinations thereof.

4. The apparatus of claim 1, wherein the cavity between the two layer structure is configured to be supportless.

5. The apparatus of claim 1, wherein the cavity is configured to have at least one pillar between the two layer structure.

6. The apparatus of claim 1, wherein the material, which is received through the at least one opening by the cavity, is used to form an atomic layer or chemical vapor deposition of the thin film layer inside the cavity, and the conformality analysis analyzes the atomic layer or chemical vapor deposition of the thin film layer.

7. The apparatus of claim 1, wherein the at least one layer structure includes a second positional indicator positioned a second distance from the at least one opening, wherein the second positional indicator includes two adjacent sub-indicators positioned a second known distance between one another, different than the first known distance between the two adjacent sub-indicators of the first positional indicator, the second known distance representing the second distance between the second positional indicator and the at least one opening.

8. The apparatus of claim 1, wherein the first positional indicator includes a third sub-indicator positioned a second known distance from one of the two adjacent sub-indicators, wherein the first known distance between the two sub-indicators indicates a whole number value of the first distance between the first positional indicator and the at least one opening, and the second known distance of the third sub-indicator from the one of the two adjacent sub-indicators indicates a decimal value of the first distance between the first positional indicator and the at least one opening.

9. The apparatus of claim 1, wherein the two adjacent sub-indicators include a first line having a first thickness, and a second line having a second thickness that is greater or lesser than the first thickness of the first line.

\* \* \* \* \*